United States Patent
Fulcomer

[19]

[11] Patent Number: 5,940,874
[45] Date of Patent: Aug. 17, 1999

[54] MEMORY DEVICE SPEED TESTER

[75] Inventor: James L. Fulcomer, Redondo Beach, Calif.

[73] Assignee: Hughes Electronics Corporation, El Segundo, Calif.

[21] Appl. No.: 08/700,552

[22] Filed: Aug. 16, 1996

[51] Int. Cl.⁶ .................................................. G06F 11/00
[52] U.S. Cl. .......................... 711/217; 711/218; 711/219; 371/21.1; 371/21.2; 371/21.3
[58] Field of Search ................................. 371/21.1, 21.2, 371/21.3; 711/217, 218, 219

[56] References Cited

U.S. PATENT DOCUMENTS

| | | | |
|---|---|---|---|
| 4,608,690 | 8/1986 | Judge | 371/21.2 |
| 4,751,636 | 6/1988 | Sibley | 711/166 |
| 4,835,774 | 5/1989 | Ooshima et al. | 371/21.2 |
| 5,072,138 | 12/1991 | Slemmer et al. | 371/21.1 |
| 5,659,549 | 8/1997 | Oh et al. | 371/21.3 |

*Primary Examiner*—Eddie P. Chan
*Assistant Examiner*—Than V. Nguyen
*Attorney, Agent, or Firm*—Michael W. Sales

[57] ABSTRACT

A memory speed testing circuit including a memory addressing circuit (11, 13, 15) for sequentially providing to the address input of the memory device a binary address A and a binary address $\bar{A}$ which is a binary 1's complement of the binary address A, wherein the binary address $\bar{A}$ is provided within a selected time interval after the provision of the binary address A when the memory device is in a read mode; a data circuit (21, 23, 24) for generating a first binary test word and a second binary test word that is a 1's complement of the first binary test word; wherein the first binary test word is input to the data port of the memory device when the binary address A is provided the address input of the memory device when the memory device is in the write mode, and wherein the second binary test word is input to the data port of the memory device when the binary address $\bar{A}$ is provided to the address input of the memory device when the memory device is in the write mode; and a comparator (25) for comparing the first binary test word with a memory read output provided by the memory device pursuant to a binary address A, and comparing the second binary test word with a memory read output provided by the memory device pursuant to a binary address $\bar{A}$ which is a 1's complement of the binary address A.

5 Claims, 2 Drawing Sheets

MEMORY DEVICE SPEED TESTER

BACKGROUND OF THE INVENTION

The disclosed invention is directed generally to circuitry for speed testing memory devices, and more particularly to circuitry for efficiently speed testing a memory device by writing complementary data into complementary memory address locations, and performing a read of a predetermined address immediately followed by a read of the 1's complement of the predetermined address.

A known speed testing technique performs a speed test for each address transition that includes a change of at least one address bit. In other words, data is read from one address and then from another address for every address change possible. Considerations with speed testing that tests every possible address transition is tester time and expense, since the number of memory accesses is significant. For an N-bit wide address, at least $2^{2N}-2^N$ memory accesses are required. An 8-bit address would therefore require at least 65,280 memory accesses. A 16-bit address would require at least 4,294,901,760 memory accesses.

SUMMARY OF THE INVENTION

It would therefore be an advantage to provide a memory speed testing technique that requires a reduced number of memory accesses.

The foregoing and other advantages are provided by the invention in a memory speed testing circuit wherein test data stored at each memory location is a 1's complement of test data stored at the 1's complement of such memory location, and wherein the outputs of successive reads performed on an address of the memory device and the 1's complement of such address are compared with test data to determine whether the memory device operated properly at a speed determined by the speed of the successive reads.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
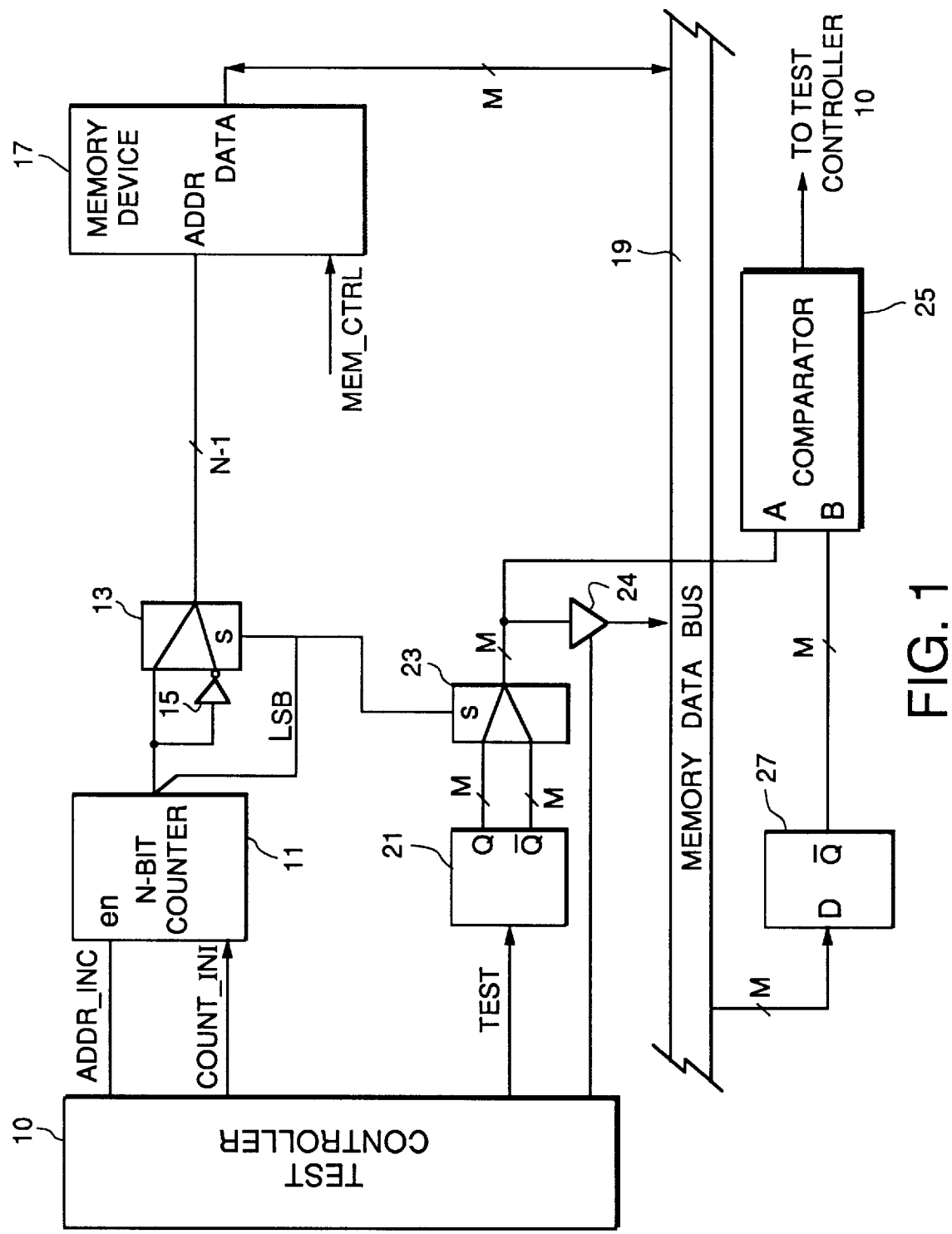
FIG. 1 is a schematic circuit diagram of a memory test circuit in accordance with the invention.

In the following detailed description and in the several figures of the drawing, like elements are identified with like reference numerals.

Referring now to FIG. 1, set forth therein is a schematic circuit diagram of a memory test circuit in accordance with the invention which includes an N-bit counter 11 which receives at an enable input an address increment signal ADDR_INC and an initial count value COUNT_INI from a test controller 10. In operation, the initial count output of the counter 11 is set by the initial count value COUNT_INI provided by the test controller, and the count output increments pursuant to each active transition of the address increment signal ADDR_INC.

The most significant N-1 bits of the output of the N-bit counter 11 are respectively provided to respective first data inputs of N-1 multiplexers 13, and are further respectively provided to N-1 inverters 15. The outputs of the N-1 inverters 15 are respectively provided to respective second data inputs of the multiplexers 13. The least significant bit (LSB) of the count output of the counter 11 is provided to the select inputs of the multiplexers 13. By way of particular example, the outputs of the N-1 multiplexers 13 are replicas of the first inputs thereto when the LSB is 0, and are replicas of the second inputs thereto when the LSB is 1. Thus, the outputs of the multiplexers 13 comprise a sequence of ordered pairs of complementary numbers, wherein the first number in each ordered pair incrementally increases from one ordered pair to the next, and wherein the second number in each other pair incrementally decreases from one ordered pair to the next. For example, assuming that N is 9 and that the initial count output is 000000000 (binary) the initial output of the N-1 multiplexers 13 would be 00 (hex). Pursuant to the next occurrence of ADDR_INC, the count output of the counter 11 would be 000000001 (binary) and the output of the N-1 multiplexers 13 would be FF (hex) as a result of the change in the input to the select inputs of the multiplexers 13 and the inversion performed by the inverters 15. At the next occurrence of ADDR_INC, the output of the multiplexers 13 would be 01 (hex), which would then become FE (hex) on the next occurrence of ADDR_INC.

Effectively, the outputs of the multiplexers 13 comprise a binary address that is achieved by XORing each of the N-1 most significant bits of the counter output with the LSB of the counter output. Stated another way, the outputs of the multiplexers 13 comprise an N-1 bit address A when the counter output an is even number, and an N-1 bit address $\overline{A}$, which is the 1's complement of the binary address A, when the counter output increments from such even number.

The outputs of the multiplexers 13 are provided as an address to the address input of a memory device 17 that is being tested. A memory control signal MEM_CTRL is provided to a control input of the memory device 17 for controlling the memory device to be in the write mode or the read mode, and a bidirectional data port of the memory device 17 is connected to an M-bit memory data bus 19.

The memory test circuit of FIG. 1 further includes an M-bit data register 21 which accepts an M-bit test data word TEST from the test controller 10, for example via a parallel input or a serial input to the data register 21. As will be more apparent herein, test data that is stored in the data register 21 prior to performance of the memory speed testing and is not changed during the testing. The non-inverted Q outputs of the data register 21 are respectively provided to respective first data inputs of M multiplexers 23, while the inverted $\overline{Q}$ outputs of the data register 21 are respectively provided to respective second data inputs of the M multiplexers 23. The select control inputs for the M multiplexers 23 are provided by the LSB of the count output of the N-bit counter 11. By way of particular example, the outputs of the M multiplexers 23 are replicas of the first inputs thereto when the LSB of the counter output of the counter 11 is 0, and are replicas of the second inputs thereto when the LSB of the counter output of the counter 11 is 1.

The outputs of the M multiplexers 23 are provided as respective inputs to M three-state buffers 24 whose outputs are provided to the M-bit memory data bus 19. The M three-state buffers 24 are selectively enabled by the test controller 10 for write operations, and disabled for read operations, so as to avoid data conflicts on the memory data bus 19. The outputs of the M multiplexers 23 are provided to an A input of a comparator 25 that receives at a B input the $\overline{Q}$ outputs of an M-bit read register 27 which has its D inputs connected to the memory data bus 19. The output of the comparator 25 is provided to the test controller 10.

For memory speed test purposes, the memory register 27 is clocked synchronously with the incrementing of the N-bit counter 11 such that data read from the memory device 17 pursuant to a particular increment of the N-bit counter 11 is latched into the read register 27 on the immediately following increment of the N-bit counter.

The test circuit of FIG. 1 more particularly operates as follows.

1. Background data is written to the memory device 17 such that data in the upper half of the address space are the 1's complements of the data in the lower half of the address space. For example, for a 256 bit deep by 8 bit wide memory device, addresses 00 (hex) through 7F (hex) could be loaded with 55 (hex), while addresses 80 through FF (hex) could be loaded with AA (hex). This can be achieved for example by initializing the counter to all 0s, loading 55 (hex) into the data register 21, enabling the three-state buffers 24, setting the memory control signal MEM_CTRL to the appropriate state for writing to the memory device 17, and incrementing the counter 11. The output of the data register 21 is kept constant, such that the output of the data multiplexers 23 alternates, as a function of the state of the LSB of the output of the counter 11, between the test data stored in the data register 21 and the 1's complement of such test data.

2. For each address location in the memory device, performing a read of such address location and immediately performing a read on the 1's complement of such address location. For example, a read of address 00 is followed immediately by a read of address FF (hex). A read of address 01 is followed immediately by a read of FE (hex). This process is repeated until the last two reads would be a read of address FF (hex) immediately followed by a read of address 00. The time interval between the read of an address and the read of its 1's complement is particularly selected to test the speed of the memory device. Effectively, the memory device 17 is tested as to whether it is sufficiently fast to provide, pursuant to an address transition wherein all address bits transition from the prior address, an output wherein all data bits transition from the prior output.

3. For each read, verify that the memory device presented the correct output data at its data port within the time allowed (i.e., the time interval between the read of an address and the read of its 1's complement). Steps 2 and 3 can be accomplished for example by disabling the three-state buffers 24, initializing the counter 11 to all 0s, maintaining the 55 (hex) in the data register 21, setting the memory control signal MEM_CTRL to the appropriate state for reading, incrementing the counter 11 at a rate that is based on the desired speed to be tested, clocking the memory register 27 synchronously with the incrementing of the counter 11, and comparing via the comparator 25 the output of the memory register 27 with the output of the data multiplexers 23.

4. Repeat steps 1–3 for a background data pattern wherein the data patterns loaded into the upper and lower halves of the address space of the memory device are swapped. In other words, the data loaded into the lower half of the address space is the 1's complement of what was previously loaded into the lower half, while the data loaded into the upper half of the address space is the 1's complement of what was previously loaded into the upper half.

Figure 2:
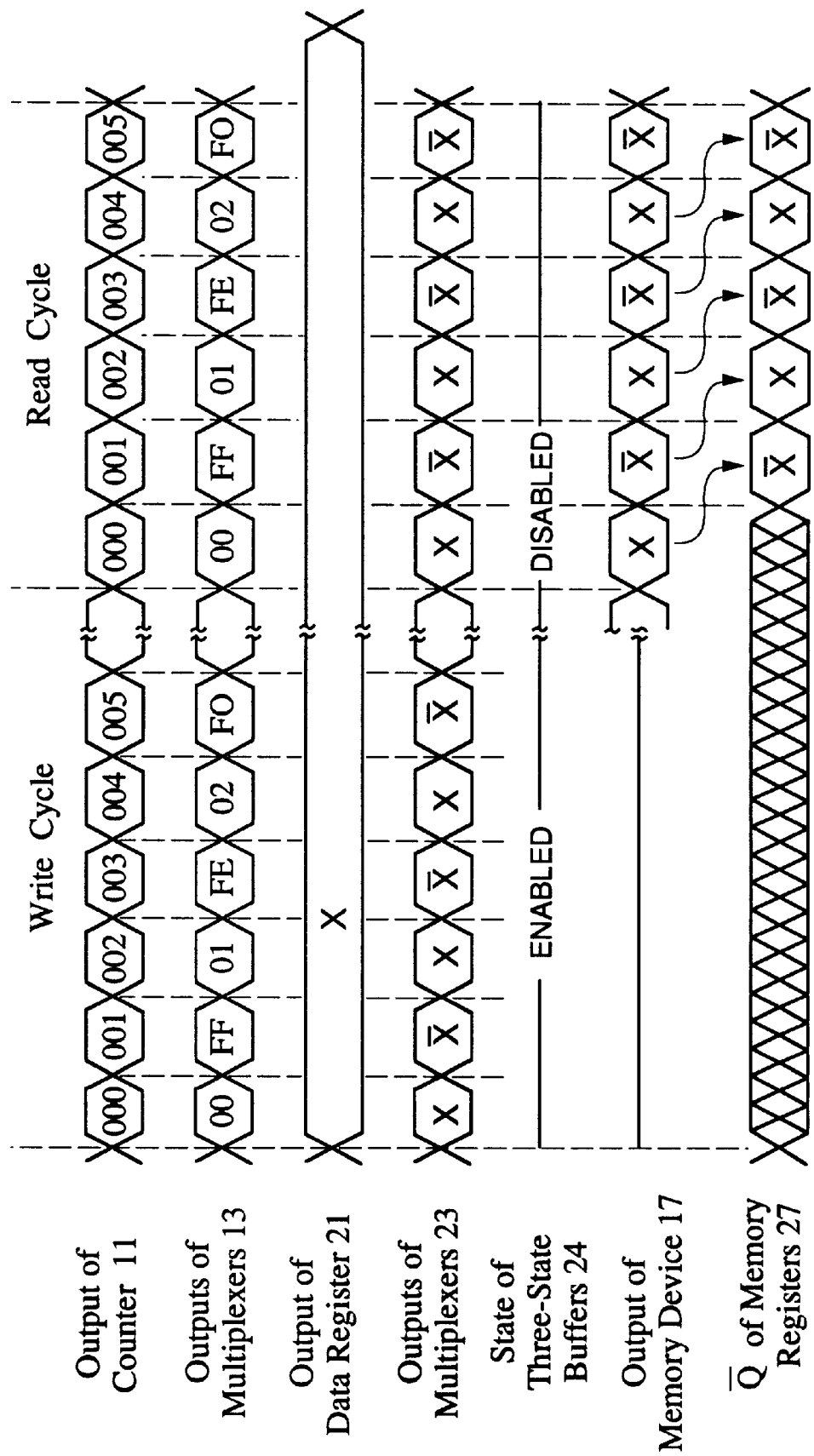
FIG. 2 schematically depicts an illustrative example of the timing of the operation of the test circuit of FIG. 1.

FIG. 2 schematically depicts an illustrative example of the timing of the operation of the test circuit of FIG. 1 for an 8-bit address and test data X.

In the foregoing test, since the data in the upper half of the address space is the 1's complement of the data in the lower half of the address space, the read of an address and the immediately following read of the 1's complement of such address forces a transition on all memory address lines and all memory data lines as between the read of an address and the immediately following read of the 1's complement of such address. By performing steps 1–3 twice with the specified data patterns, the speed of each data bit transition from 0-to-1 and from 1-to-0 is tested for every address transition wherein all bits of the address change states.

The foregoing has thus been a disclosure of a memory speed testing technique that advantageously performs significantly fewer memory accesses that known speed testing techniques.

Although the foregoing has been a description and illustration of specific embodiments of the invention, various modifications and changes thereto can be made by persons skilled in the art without departing from the scope and spirit of the invention as defined by the following claims.

What is claimed is:

1. Apparatus for speed testing a memory device having an address input and a data port, comprising:

memory addressing means for sequentially providing to the address input of the memory device a binary address A and a binary address $\overline{A}$ which is a binary 1's complement of the binary address A, wherein the binary address $\overline{A}$ is provided within a selected time interval after the provision of the binary address A when the memory device is in a read mode;

data means for generating a first binary test word and a second binary test word that is a 1's complement of the first binary test word;

wherein said first binary test word is input to the data port of the memory device when said binary address A is provided the address input of the memory device when the memory device is in the write mode, and wherein said second binary test word is input to the data port of the memory device when said binary address $\overline{A}$ is provided to the address input of the memory device when the memory device is in the write mode; and means for comparing the first binary test word with a memory read output provided by the memory device pursuant to a binary address A, and comparing the second binary test word with a memory read output provided by the memory device pursuant to a binary address $\overline{A}$ which is a 1's complement of the binary address A to verify that the memory device presented the correct output data at its data port within a predetermined time interval.

2. The apparatus of claim 1 wherein said memory addressing means comprises:

an N-bit counter for providing an N-bit counter output;

respective inverters responsive to the most significant N-1 bits of the N-bit counter output for providing a 1's complement of the most significant N-1 bits of the N-bit counter; and selection means controlled by the least significant bit (LSB) of the N-bit counter output for providing to the address input of the random access memory an address that is (a) a replica of the most significant N-1 bits of the N-bit counter output when the LSB of the counter output is of a first logical state, or (b) a replica of the 1's complement of the most significant N-1 bits of the N-bit counter output when the LSB of the counter output is of a second logical state.

3. The apparatus of claim 2 wherein said data means comprises:

an M-bit register for receiving an M-bit input word for providing a non-inverter M-bit register output which is a replica of said M-bit input word and an inverted M-bit resister output which is a 1's complement of said M-bit input word;

selection means controlled by the least significant bit (LSB) of the N-bit counter output for providing to said comparison means (a) a replica of the non-inverted register output when the LSB of the counter output is of a first logical state, or (b) a replica of the inverted M-bit register output when the LSB of the counter output is of a second logical state.

4. The apparatus of claim 1 wherein said predetermined time interval is equal to the time interval between the read of an address and the read of its 1's complement.

5. A method for testing a memory storage device having $2^N$ storage locations, comprising the steps of:

(A) writing to each of the memory storage locations respective data words such that the binary data word written to the storage location having a binary address $\overline{A}$ is the binary 1's complement of the binary data word written to the storage location having a binary address A, wherein the binary address $\overline{A}$ is a binary 1's complement of the binary address A;

(B) sequentially providing to the memory storage device with a binary read address A and a binary read address $\overline{A}$ which is a binary 1's complement of the binary read address A, such that the memory device provides a first memory output pursuant to the binary read address A and a second memory output pursuant to the binary read address $\overline{A}$, the binary read address $\overline{A}$ being provided within a selected time interval after the provision of the binary read address A;

(C) comparing the first memory output with a first binary test word, and comparing the second memory output with a second binary test word; and (D) repeating the steps (A) through (C) until the binary address A has taken on each of the values of 0 through $2^N$.

* * * * *